United States Patent [19]

Inoue et al.

[11] Patent Number: 5,234,513
[45] Date of Patent: Aug. 10, 1993

[54] FE-NI ALLOY SHEET EXCELLENT IN HOT WORKABILITY, ADHESIVITY TO PLATING LAYER AND SOLDERABILITY, AND METHOD FOR MANUFACTURING SAME

[75] Inventors: Tadashi Inoue; Masayuki Kinoshita; Tomoyoshi Okita, all of Tokyo, Japan

[73] Assignee: NKK Corporation, Tokyo, Japan

[21] Appl. No.: 775,703

[22] Filed: Oct. 10, 1991

[30] Foreign Application Priority Data

Oct. 22, 1990 [JP] Japan .................. 2-281944

[51] Int. Cl.$^5$ .................. C21D 7/00; C22F 1/10
[52] U.S. Cl. .................. 148/541; 148/846; 148/556; 148/621; 148/676; 148/336; 148/426; 420/94; 420/459
[58] Field of Search .................. 148/2, 11.5 N, 12 A, 148/12 E, 336, 312, 426, 336, 541, 546, 556, 605, 621, 676; 420/94, 441, 459, 580, 581, 426, 429, 459, 94

[56] References Cited

FOREIGN PATENT DOCUMENTS 48-78017 10/1973 Japan .
62-207845 9/1987 Japan .

Primary Examiner—W. Dean
Assistant Examiner—Sikyin Ip
Attorney, Agent, or Firm—Frishauf, Holtz, Goodman & Woodward

[57] ABSTRACT

An Fe-Ni alloy sheet excellent in hot workability, adhesivity to a plating layer and solderability, which consists essentially of:

| | |
|---|---|
| nickel (Ni): | from over 38 to 52 wt. %, |
| silicon (Si): | from 0.01 to 0.15 wt. %, |
| calcium (Ca): | from 0.0002 to 0.0020 wt. %, |
| magnesium (Mg): | from 0.0003 to 0.0020 wt. %, |
| where, | |
| Ca + ½Mg: | from 0.0005 to 0.0025 wt. %, | and the balance being iron and incidental impurities,
where, the contents of carbon (C), nitrogen (N), sulfur (S), oxygen (O), phosphorus (P) and aluminum (Al) as the incidental impurities being respectively:
up to 0.0050 wt. % for carbon,
up to 0.0020 wt. % for nitrogen,
up to 0.0020 wt. % for sulfur,
up to 0.0040 wt. % for oxygen,
up to 0.0040 wt. % for phosphorus, and
under 0.010 wt.% for aluminum,
where, $1/10\ C + 1/10\ N + S + 1/5\ O + \frac{1}{2}\ P \leq 0.0045$ wt. %, and $$\frac{Ca + 1/2\ Mg}{S + 1/5\ O} \geq 1;\ \text{and}$$

the surface portion of the Fe-Ni alloy sheet having a silicon (Si) segregation rate, as expressed by the following formula, of up to 10%:

$$\left| \frac{\left(\begin{array}{c}\text{Si concentration in}\\\text{segregation region}\end{array}\right) - \left(\begin{array}{c}\text{Average Si}\\\text{concentration}\end{array}\right)}{\text{(Average Si concentration)}} \right| \times 100.$$

10 Claims, 4 Drawing Sheets

FE-NI ALLOY SHEET EXCELLENT IN HOT WORKABILITY, ADHESIVITY TO PLATING LAYER AND SOLDERABILITY, AND METHOD FOR MANUFACTURING SAME

REFERENCE TO PATENTS, APPLICATIONS AND PUBLICATIONS PERTINENT TO THE INVENTION

As far as we know, there is available the following prior art document pertinent to the present invention:

Japanese Patent Provisional Publication No. 62-207,845 dated Sep. 12, 1987.

The contents of the prior art disclosed in the above-mentioned prior art document will be discussed hereafter under the heading of the "BACKGROUND OF THE INVENTION".

BACKGROUND OF THE INVENTION

1. Field of the Invention

The present invention relates to an Fe-Ni alloy sheet, which is excellent in hot workability, adhesivity to a plating layer, and solderability, and is particularly applicable as a material for a lead frame of an integrated circuit, and a method for manufacturing same.

2. Related Art Statement

A conventional Fe-Ni alloy widely used as a material for a lead frame of an integrated circuit consists essentially of 42 wt. % nickel and the balance of iron and incidental impurities with a view to minimizing the difference in the thermal expansion coefficient from the other component materials of the integrated circuit, i.e., a semiconductor, glass and ceramics.

A lead frame of an integrated circuit comprising such an Fe-Ni alloy is usually manufactured as follows: Preparing an ingot or a continuously cast slab of the above-mentioned Fe-Ni alloy; subjecting the ingot or the continuously cast slab thus prepared to a slabbing rolling, a hot rolling and a cold rolling to prepare an Fe-Ni alloy sheet; slitting the thus prepared Fe-Ni alloy sheet into a plurality of belts having a prescribed width; and subjecting the thus obtained belt to a punching or a photo-etching to manufacture a lead frame having a prescribed shape. A noble metal plating such as a silver plating is usually applied to the body portion of the thus manufactured lead frame except for the legs thereof to form a noble metal plating layer such as a silver plating layer on the surface of the body of the lead frame, thereby improving operability of a wire-bonding.

Then, an integrated circuit is manufactured by subjecting the lead frame to a die-bonding, a wire-bonding and a packaging in this order.

The legs of the thus manufactured integrated circuit are soldered to the substrate sheet. A tin plating is applied to the legs to improve solderability thereof.

As is clear from the above description, the Fe-Ni alloy sheet used as a material for a lead frame is required to be excellent both in adhesivity to a plating layer, particularly to a silver or gold plating layer and in solderability.

However, the above-mentioned conventional Fe-Ni alloy sheet has a poor adhesivity to a silver plating layer. More particularly, in an integrated circuit manufactured by the use of a lead frame made from the conventional Fe-Ni alloy sheet, heat produced when subjecting the lead frame to a wire-bonding may cause the production of "blisters" in the silver plating layer or the peel-off of the silver plating layer. In order to solve such problems, therefore, it is necessary, as the conventional practice, to apply a strike plating to the body of the lead frame with nickel or copper prior to the silver plating of the body of the lead frame, resulting in operational complication and increase in the manufacturing cost.

In the integrated circuit manufactured using a lead frame made from the conventional Fe-Ni alloy sheet, furthermore, when tin-plating the legs of the integrated circuit for the purpose of improving solderability, as described above, fine acicular crystals (hereinafter referred to as the "whiskers") tend to be produced in an abnormally large amount in the tin plating layer. This abnormal production of the whiskers leads to a longer wetting time between the tin plating layer and the solder, thus resulting in more difficult adhesion of the solder to the legs of the lead frame applied with the tin plating, and hence in a lower solderability.

For the purpose of solving the above-mentioned problem, Japanese Patent Provisional Publication No. 62-207,845 dated Sep. 12, 1987 discloses an Fe-Ni alloy sheet excellent in adhesivity to a plating layer, which consists essentially of:

| | |
|---|---|
| nickel: | from 35 to 55 wt. %, |
| aluminum: | from 0.010 to 0.100 wt. %, |
| calcium: | from 0.0005 to 0.0040 wt. %, |
| carbon: | up to 0.05 wt. %, |
| nitrogen: | up to 0.005 wt. %, |
| sulfur: | up to 0.003 wt. %, |
| chromium: | up to 0.5 wt. %, and |
| the balance being iron and incidental impurities. | |

(hereinafter referred to as the "prior art").

The object of the prior art is to improve adhesivity to a silver plating layer without applying a nickel strike plating to the lead frame made from the Fe-Ni alloy sheet of the prior art. In order to achieve this object, aluminum and calcium in respective prescribed amounts are added to the Fe-Ni alloy in the prior art.

In order to improve adhesivity to the silver plating layer in the prior art, however, the silver plating layer must have a thickness of at least 3 μm. The silver plating layer, having such a large thickness, results in a higher manufacturing cost of the integrated circuit. With a view to reducing the manufacturing cost of the integrated circuit, therefore, the silver plating layer formed on the surface of the lead frame made from the Fe-Ni alloy sheet should preferably have a thickness of under 3 μm. However, even when the silver plating layer has such a thin thickness, it is impossible by the prior art to ensure an excellent adhesivity to the silver plating layer.

In addition, in the integrated circuit manufactured using the lead frame made from the Fe-Ni alloy sheet of the prior art, application of the tin plating to the legs of the integrated circuit with a view to improving solderability, causes the production of whiskers in an abnormally large amount in the tin plating layer, thus resulting in considerable decrease in solderability. Such an abnormal production of whiskers is attributable to the fact that an aluminum oxide film having a non-uniform surface is formed on the surface of the lead frame under the effect of the annealing during the manufacturing process of the lead frame because of the aluminum content of at least 0.010 wt. in the Fe-Ni alloy sheet of the prior art.

Furthermore, an ingot or a continuously cast slab of the Fe-Ni alloy of the prior art is poor in hot workability, and the slabbing rolling of such an ingot or a continuously cast slab causes the production of considerable flaws on the surface of the resultant finished slab, thus resulting in a lower production yield.

Under such circumstances, there is a strong demand for the development of an Fe-Ni alloy sheet, which is excellent in hot workability, adhesivity to a plating layer and solderability, and is high in the production yield, and a method for manufacturing same, but such an Fe-Ni alloy sheet and a method for manufacturing same have not as yet been proposed.

SUMMARY OF THE INVENTION

An object of the present invention is therefore to provide an Fe-Ni alloy sheet, which is excellent in hot workability, adhesivity to a plating layer and solderability, and is high in the production yield, and a method for manufacturing same.

In accordance with one of the features of the present invention, there is provided an Fe-Ni alloy sheet excellent in hot workability, adhesivity to a plating layer and solderability, which consists essentially of:

| | |
|---|---|
| nickel (Ni): | from over 38 to 52 wt. %, |
| silicon (Si): | from 0.01 to 0.15 wt. %, |
| calcium (Ca): | from 0.0002 to 0.0020 wt. %, |
| magnesium (Mg): | from 0.0003 to 0.0020 wt. %, |
| where, | |
| Ca + ½Mg: | from 0.0005 to 0.0025 wt. %, | and the balance being iron and incidental impurities, where, the contents of carbon (C), nitrogen (N), sulfur (S), oxygen (O), phosphorus (P) and aluminum (Al) as said incidental impurities being respectively:
up to 0.0050 wt. % for carbon,
up to 0.0020 wt. % for nitrogen,
up to 0.0020 wt. % for sulfur,
up to 0.0040 wt. % for oxygen,
up to 0.0040 wt. % for phosphorus, and
under 0.010 wt.% for aluminum,
where, $1/10\ C + 1/10\ N + S + 1/5\ O + \frac{1}{2}\ P \leq 0.0045$ wt. %, and $$\frac{Ca + 1/2\ Mg}{S + 1/5\ O} \geq 1;\ \text{and}$$

the surface portion of said Fe-Ni alloy sheet having a silicon (Si) segregation rate, as expressed by the following formula, of up to 10%:

$$\left| \frac{\left(\begin{array}{c}\text{Si concentration in}\\ \text{segregation region}\end{array}\right) - \left(\begin{array}{c}\text{Average Si}\\ \text{concentration}\end{array}\right)}{\text{(Average Si concentration)}} \right| \times 100.$$

In accordance with another one of the features of the present invention, there is provided a method for manufacturing an Fe-Ni alloy sheet excellent in hot workability, adhesivity to a plating layer and solderability, which comprises the steps of:

preparing an ingot or a continuously cast slab of an Fe-Ni alloy consisting essentially of:

| | |
|---|---|
| nickel (Ni): | from over 38 to 52 wt. %, |
| silicon (Si): | from 0.01 to 0.15 wt. %, |
| calcium (Ca): | from 0.0002 to 0.0020 wt. %, |
| magnesium (Mg): | from 0.0003 to 0.0020 wt. %, |
| where, | |

-continued

| | |
|---|---|
| Ca + ½Mg: | from 0.0005 to 0.0025 wt. %, | and the balance being iron and incidental impurities,
the balance being iron and incidental impurities,
where, the contents of carbon (C), nitrogen (N), sulfur (S), oxygen (O), phosphorus (P) and aluminum (Al) as said incidental impurities being respectively:
up to 0.0050 wt. % for carbon,
up to 0.0020 wt. % for nitrogen,
up to 0.0020 wt. % for sulfur,
up to 0.0040 wt. % for oxygen,
up to 0.0040 wt. % for phosphorus, and
under 0.010 wt. % for aluminum, where, $1/10\ C + 1/10\ N + S + 1/5\ O + \frac{1}{2}\ P \leq 0.0045$ wt. %, and $$\frac{Ca + 1/2\ Mg}{S + 1/5\ O} \geq 1;$$

subjecting said ingot or said continuously cast slab to a slabbing rolling, a scarfing, a hot rolling, a descaling, another scarfing, at least one cold rolling accompanied by a recrystallization annealing, a temper rolling and a stress-relieving annealing in this order to prepare a sheet of said Fe-Ni alloy;

heating said ingot or said continuously cast slab, when subjecting same to said slabbing rolling, in a heating atmosphere having a hydrogen sulfide (H$_2$S) concentration of up to 100 ppm to a temperature (T)(°C.) within a range of from 1,150° to 1,300° C. for a period of time (t) (hr) as expressed by the following formula:

$$7.71 - 5.33 \times 10^{-3}T \leq \log t \leq 8.00 - 5.33 \times 10^{-3}T,$$

then, subjecting same to said slabbing rolling at a sectional reduction rate of at least 35%, and then slowly cooling same, thereby adjusting a silicon (Si) segregation rate, as expressed by the following formula, of the surface portion of said Fe-Ni alloy sheet to up to 10%:

$$\left| \frac{\left(\begin{array}{c}\text{Si concentration in}\\ \text{segregation region}\end{array}\right) - \left(\begin{array}{c}\text{Average Si}\\ \text{concentration}\end{array}\right)}{\text{(Average Si concentration)}} \right| \times 100.$$

The above-mentioned slabbing rolling may comprise the steps of:

heating said ingot or said continuously cast slab in a heating atmosphere having a hydrogen sulfide (H$_2$S) concentration of up to 100 ppm to a temperature (T) (°C.) within a range of from 1,150° to 1,300° C. for a period of time (t)(hr) as expressed by the following formula:

$$7.40 - 5.33 \times 10^{-3}T \leq \log t \leq 7.71 - 5.33 \times 10^{-3}T,$$

then subjecting same to a primary slabbing rolling as part of said slabbing rolling at a sectional reduction rate within a range of from 20 to 70%, then heating same again in a heating atmosphere having a hydrogen sulfide (H$_2$S) concentration of up to 100 ppm to a temperature (T)(°C.) within a range of from 1,150° to 1,300° C. for a period of time (t)(hr) as expressed by the above-mentioned formula, then subjecting same to a secondary slabbing rolling as part of said slabbing rolling at a sectional reduction rate within a range of from 20 to 70%, and then slowly cooling same, thereby adjusting a silicon (Si) segregation rate, as expressed by the following formula, of the surface portion of said Fe-Ni alloy sheet to up to 10%:

$$\left| \frac{\left(\begin{array}{c}\text{Si concentration in} \\ \text{segregation region}\end{array}\right) - \left(\begin{array}{c}\text{Average Si} \\ \text{concentration}\end{array}\right)}{(\text{Average Si concentration})} \right| \times 100.$$

DETAILED DESCRIPTION OF PREFERRED EMBODIMENTS

Figure 1:
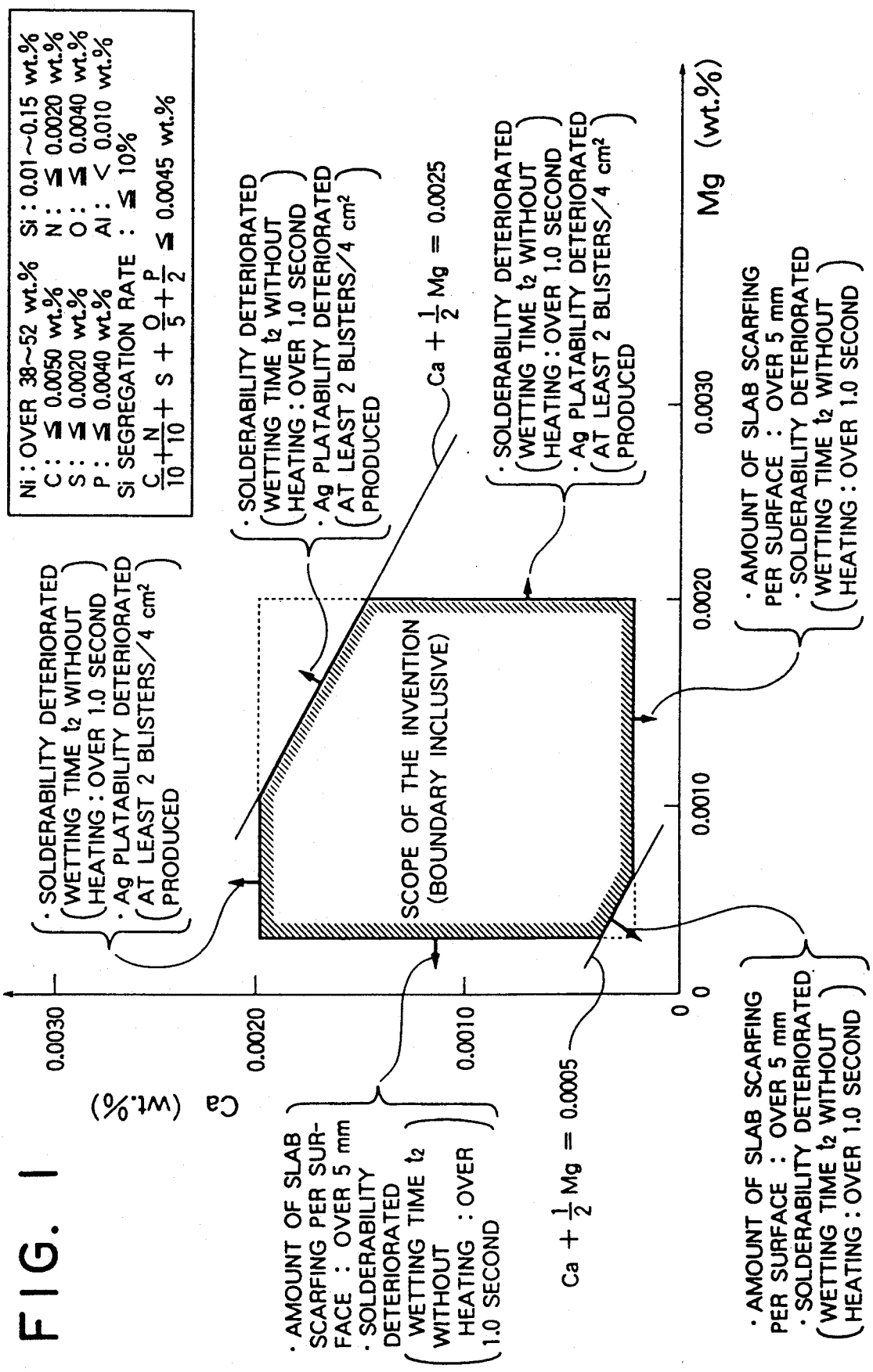
FIG. 1 is a graph illustrating, when changing the contents of calcium and magnesium, respectively, in a slab and a sheet, each of which comprises an Fe-Ni alloy having a chemical composition within the scope of the present invention except for the contents of calcium and magnesium, the effect of each of the various contents of calcium and magnesium, on the amount of slab scarfing, solderability and adhesivity to a silver plating layer.

From the above-mentioned point of view, extensive studies were carried out to develop an Fe-Ni alloy sheet, which is excellent in hot workability, adhesivity to a plating layer and solderability, and is high in the production yield.

As a result, the following findings were obtained: It is possible to obtain an Fe-Ni alloy sheet, which is excellent in hot workability, adhesivity to a plating layer and solderability, and is high in the production yield, by adjusting the chemical composition and the silicon segregation rate of the Fe-Ni alloy sheet within prescribed ranges. More specifically, adhesivity to a plating layer can be improved by limiting the contents of carbon, sulfur, oxygen, phosphorus and aluminum as the incidental impurities to up to respective prescribed amounts, limiting the silicon content within a prescribed range, and limiting the silicon segregation rate within a prescribed range. In addition, the production of whiskers during the tin plating can be inhibited, thereby improving solderability, by limiting the contents of carbon, nitrogen, sulfur and oxygen as the incidental impurities to up to respective prescribed amounts, limiting the silicon content within rate within a prescribed range. Furthermore, hot work ability of the Fe-Ni alloy can be improved, thereby minimizing the production of surface flaws of the slab during the slabbing rolling as well as the production of fine inner cracks of the slab during the slabbing rolling, thereby ensuring a high production yield, by limiting the contents of carbon, nitrogen, sulfur, oxygen and phosphorus as the incidental impurities to up to respective prescribed amounts, and limiting the contents of magnesium and calcium within respective prescribed ranges.

The following findings were additionally obtained: The silicon segregation rate can be adjusted within a prescribed range by heating an ingot or a continuously cast slab of the Fe-Ni alloy at a temperature within a prescribed range for a period of time within a prescribed range, and slabbing-rolling same at a sectional reduction rate within a prescribed range.

The present invention was made on the basis of the above-mentioned findings. Now, the Fe-Ni alloy sheet of the present invention is described below further in detail.

The chemical composition of the Fe-Ni alloy sheet of the present invention is limited within the above-mentioned range for the following reasons.

(1) Nickel

The thermal expansion coefficient of the Fe-Ni alloy sheet depends upon the nickel content therein. With a nickel content of up to 38 wt. % or over 52 wt. %, the thermal expansion coefficient becomes excessively large, so that there is a considerable difference in thermal expansion coefficient from the other component materials of the integrated circuit, i.e., a semiconductor, glass and ceramics. The nickel content should therefore be limited within a range of from over 38 wt. % to up to 52 wt. %.

(2) Silicon

Silicon has a function of improving corrosion resistance of the Fe-Ni alloy sheet. However, with a silicon content of under 0.01 wt. %, a desired effect as described above is not available. With a silicon content of over 0.15 wt. %, on the other hand, an aluminum oxide film having a non-uniform surface tends to be formed on the surface of the lead frame under the effect of the annealing during the manufacturing process of the lead frame, thus making it impossible to impart an excellent adhesivity to a plating layer and an excellent solderability to the Fe-Ni alloy sheet. The silicon content should therefore be limited within a range of from 0.01 to 0.15 wt. %.

Even with a silicon content within the above-mentioned range, an excessively high silicon segregation rate in the surface portion of the Fe-Ni alloy sheet over a prescribed value results in the decrease in adhesivity to a plating layer and solderability of that surface portion. In order to prevent the local decrease in adhesivity to a plating layer and solderability of the surface portion, therefore, it is necessary, in addition to the limitation of the silicon content as described above, to limit the silicon segregation rate, as expressed by the following formula, of the surface portion of the Fe-Ni alloy sheet to up to 10%:

$$\left| \frac{\left(\begin{array}{c}\text{Si concentration in}\\ \text{segregation region}\end{array}\right) - \left(\begin{array}{c}\text{Average Si}\\ \text{concentration}\end{array}\right)}{(\text{Average Si concentration})} \right| \times 100.$$

(3) Calcium

Calcium has a function of causing sulfur and oxygen as the incidental impurities to precipitate in the form of stable and non-detrimental substances, and thus improving hot workability of the Fe-Ni alloy. With a calcium content of under 0.0002 wt. %, however, a desired effect as described above is not available, with the production of surface flaws on the slab and fine inner cracks in the Fe-Ni alloy sheet. With a calcium content of over 0.0020 wt. %, on the other hand, a firm oxide film mainly comprising calcium is formed on the surface of the Fe-Ni alloy sheet, thus making it impossible to impart an excellent adhesivity to a plating layer and an excellent solderability to the Fe-Ni alloy sheet. The calcium content should therefore be limited within a range of from 0.0002 to 0.0020 wt. %.

(4) Magnesium

As in the case of calcium, magnesium has a function of causing sulfur and oxygen as the incidental impurities to precipitate in the form of stable and non-detrimental substances and thus improving hot workability of the Fe-Ni alloy. With a magnesium content of under 0.0003 wt. %, however, a desired effect as described above is not available, with the production of surface flaws on the slab and fine inner cracks in the Fe-Ni alloy sheet. With a magnesium content of over 0.0020 wt. %, on the other hand, a firm oxide film mainly comprising magnesium is formed on the surface of the Fe-Ni alloy sheet, thus making it impossible to impart an excellent adhesivity to a plating layer and an excellent solderability to the Fe-Ni alloy sheet. The magnesium content should therefore be limited within a range of from 0.0003 to 0.0020 wt. %.

Magnesium is different from calcium in the temperature region for forming the precipitates of sulfur and oxygen. It is therefore possible to cause sulfur and oxygen to precipitate in the form of stable and non-detrimental substances and thus to further improve hot workability of the Fe-Ni alloy by adding both magnesium and calcium. Even when the Fe-Ni alloy contains both magnesium and calcium in amounts within the scope of the present invention, hot workability of the Fe-Ni alloy cannot sometimes be improved sufficiently. This is explained below with reference to FIG. 1.

FIG. 1 is a graph illustrating, when changing the contents of calcium and magnesium, respectively, in a slab and a sheet, each of which comprises an Fe-Ni alloy having a chemical composition within the scope of the present invention except for the contents of calcium and magnesium, the effect of each of the various contents of calcium and magnesium, on the amount of slab scarfing, solderability and adhesivity to a silver plating layer.

As is clear from FIG. 1, even with a calcium (Ca) content of at least 0.0002 wt. % and a magnesium (Mg) content of at least 0.0003 wt. %, when the total amount of Ca+½ Mg is under 0.0005 wt. %, hot workability of the Fe-Ni alloy is degraded, thus resulting in an amount of slab scarfing of over 5 mm per surface, and fine inner cracks are produced in the Fe-Ni alloy sheet. As a result, when tin-plating the legs of the lead frame made from the Fe-Ni alloy sheet and then soldering same, the wetting time between the tin plating layer and the solder exceeds 1.0 second, thus causing the decrease in solderability. On the other hand, even with a calcium content and a magnesium content both of up to 0.0020 wt. %, when the total amount of Ca+½ Mg is over 0.0025 wt. %, a firm oxide film mainly comprising calcium and magnesium is formed on the surface of the Fe-Ni alloy sheet. As a result, in the case where the legs of the lead frame made from the Fe-Ni alloy sheet is subjected sequentially to the tin plating and the soldering, whiskers are produced in an abnormally large amount in the tin plating layer, thus resulting in a wetting time between the tin plating layer and the solder of over 1.0 second, and hence in a decreased solderability. In addition, two or more blisters are produced per 4 cm$^2$ of the silver plating layer, causing the decrease in adhesivity to the silver plating layer. The total amount of Ca+½ Mg should therefore be limited within a range of from 0.0005 to 0.0025 wt. %.

(5) Carbon

Carbon is one of impurities inevitably entrapped in the Fe-Ni alloy. The carbon content should preferably be the lowest possible. With a carbon content of over 0.0050 wt. %, carbides precipitate in a large amount in the Fe-Ni alloy, thus deteriorating hot workability thereof. As a result, considerable surface flaws are produced on the slab during the slabbing rolling thereof, thus reducing the production yield, and fine inner cracks are produced in the Fe-Ni alloy sheet, thus causing the decrease in solderability. Furthermore, a carbon content of over 0.0050 wt. % seriously impairs also adhesivity to a plating layer. The carbon content should therefore be limited to up to 0.0050 wt. %, and more preferably, to up to 0.0030 wt. %.

(6) Nitrogen

Nitrogen is one of impurities inevitably entrapped in the Fe-Ni alloy. The nitrogen content should preferably be the lowest possible. With a nitrogen content of over 0.0020 wt. %, nitrides precipitate onto the austenitic crystal grain boundaries in the Fe-Ni alloy, thus deteriorating hot workability thereof. As a result, considerable surface flaws are produced on the slab during the slabbing rolling thereof, thus reducing the production yield, and fine cracks are produced in the Fe-Ni alloy sheet, thus causing the decrease in solderability. Furthermore, a nitrogen content of over 0.0020 wt. % seriously impairs also adhesivity to a plating layer. The nitrogen content should therefore be limited to up to 0.0020 wt. %, and more preferably, to up to 0.0015 wt. %.

(7) Sulfur

Sulfur is one of impurities inevitably entrapped in the Fe-Ni alloy. The sulfur content should preferably be the lowest possible With a sulfur content of over 0.0020 wt. %, sulfides precipitate onto the austenitic crystal grain boundaries in the Fe-Ni alloy to embrittle the crystal grain boundaries, thus seriously deteriorating hot workability of the Fe-Ni alloy. Furthermore, with a sulfur content of over 0.0020 wt. %, considerable non-metallic inclusions are produced in the Fe-Ni alloy, thus resulting in serious decrease in adhesivity to a plating layer and solderability. The sulfur content should therefore be limited to up to 0.0020 wt. %, and more preferably, to up to 0.0010 wt. %.

(8) Oxygen

Oxygen is one of impurities inevitably entrapped in the Fe-Ni alloy. The oxygen content should preferably be the lowest possible. With an oxygen content of over 0.0040 wt. %, low-melting-point oxides precipitate onto the austenitic crystal grain boundaries in the Fe-Ni alloy, thus seriously deteriorating hot workability thereof, and causing the production of non-metallic inclusions in a considerable amount in the Fe-Ni alloy. As a result, adhesivity to a plating layer and solderability are seriously reduced. The oxygen content should therefore be limited to up to 0.0040 wt. %, and more preferably, to up to 0.0025 wt. %.

(9) Phosphorus

Phosphorus is one of impurities inevitably entrapped in the Fe-Ni alloy. The phosphorus content should preferably be the lowest possible. With a phosphorus content of over 0.0040 wt. %, phosphides precipitate onto the austenitic crystal grain boundaries in the Fe-Ni alloy to embrittle the crystal grain boundaries, thus seriously deteriorating hot workability of the Fe-Ni alloy, and also deteriorating adhesivity to a plating layer. The phosphorus content should therefore be limited to up to 0.0040 wt. %, and more preferably, to up to 0.0010 wt. %.

Even when the contents of carbon (C), nitrogen (N), sulfur (S), oxygen (O) and phosphorus (P) as the incidental impurities are within the scope of the present invention, a total amount of $1/10\ C + 1/10\ N + S + 1.5\ O + \frac{1}{2}\ P$ of over 0.0045 wt. % leads to serious embrittlement of the austenitic crystal grain boundaries under the effects of the decrease in strength of the austenitic grain boundaries by nitrogen, sulfur, oxygen and phosphorus and the strengthening of the interior of the austenitic crystal grains by carbon. As a result, fine cracks are produced at the triple point on the austenitic grain boundary during the slabbing rolling of the slab. These fine cracks remain unwelded in the Fe-Ni alloy sheet as the fine inner cracks, even by applying the hot rolling after the slabbing rolling, thus resulting in a considerable decrease in solderability. The total amount of $1/10\ C - 1/10\ N + S + 1/5\ O + \frac{1}{2}\ P$ should therefore be limited to up to 0.0045 wt. %.

(10) Aluminum

Aluminum is one of impurities inevitably entrapped in the Fe-Ni alloy. The aluminum content should preferably be the lowest possible. With an aluminum content of at least 0.010 wt. %, a firm aluminum oxide film is formed on the surface of the Fe-Ni alloy sheet, resulting in a seriously decreased adhesivity to a plating layer. With an aluminum content of at least 0.010 wt. %, furthermore, aluminum causes, together with calcium, the low-melting-point oxides to precipitate in the Fe-Ni alloy, thus resulting in a poorer hot workability thereof. The aluminum content should therefore be limited to under 0.010 wt. %, and more preferably, to up to 0.0050 wt. %.

For calcium (Ca) and magnesium (Mg) as the constituent elements and sulfur (S) and oxygen (O) as the incidental impurities in the Fe-Ni alloy sheet, furthermore, the following requirements must be met. More specifically, the lower limit value of the total amount of $Ca + \frac{1}{2}$ Mg varies along with the change in the total amount of $S + 150\ O$ within the above-mentioned range of the total amount of $Ca + \frac{1}{2}$ Mg. This is explained further in detail below with reference to FIG. 2.

Figure 2:
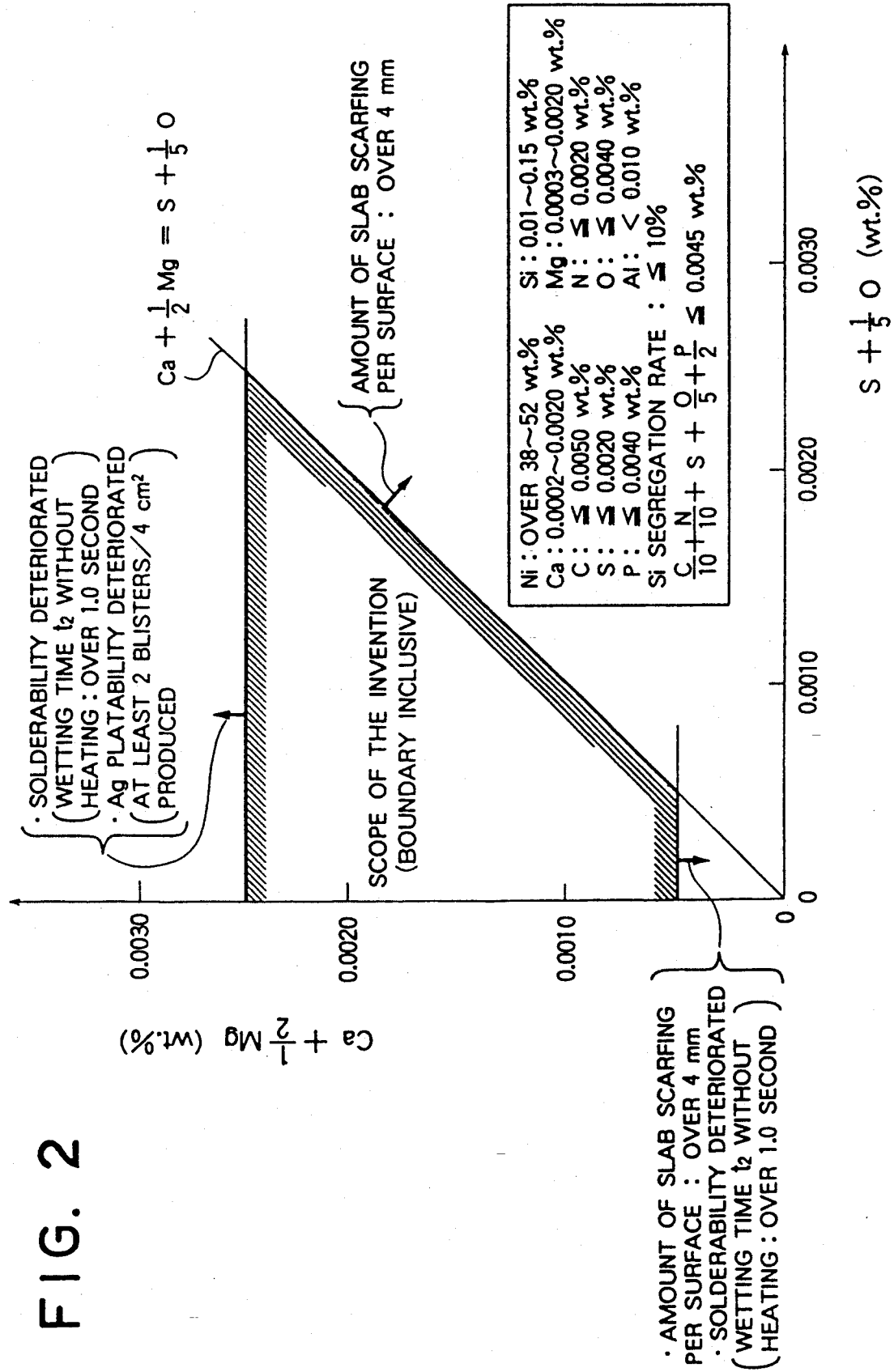
FIG. 2 is a graph illustrating, when changing values of Ca+½ Mg and S+1/5 O, respectively, in a slab and a sheet, each of which comprises an Fe-Ni alloy having a chemical composition within the scope of the present invention except for the Values of Ca+½ Mg and S+1/5 O, the effect of each of the various values of Ca+½ Mg and S+1/5 O, on the amount of slab scarfing, solderability and adhesivity to a silver plating layer.

FIG. 2 is a graph illustrating, when changing values of $Ca + \frac{1}{2}$ Mg and $S + 1/5$ O, respectively, in a slab and a sheet, each of which comprises an Fe-Ni alloy having a chemical composition within the scope of the present invention except for the values of $Ca + \frac{1}{2}$ Mg and $S + 1/5$ O, the effect of each of the various values of $Ca + \frac{1}{2}$ Mg and $S + 1/5$ O, on the amount of slab scarfing, solderability, and adhesivity to a silver plating layer.

As is clear from FIG. 2, even when the contents of calcium, magnesium, sulfur and oxygen are within the scope of the present invention and the total amount of $Ca + \frac{1}{2}$ Mg is within the scope of the present invention, sulfur and oxygen cannot be precipitated sufficiently in the form of stable and non-detrimental substances, if the total amount of $Ca + \frac{1}{2}$ Mg is smaller than the total amount of $S + 1/5$ O, i.e., $(Ca + \frac{1}{2}\ Mg)/(S + 1/5\ O) < 1$. As a result, the amount of slab scarfing per surface increases to over 4 mm, and hot workability of the Fe-Ni alloy cannot be sufficiently improved. When the contents of calcium, magnesium, sulfur and oxygen are within the scope of the present invention, the total amount of $Ca + \frac{1}{2}$ Mg is within the scope of the present invention, and the total amount of $Ca + \frac{1}{2}$ Mg is equal to or larger than the total amount of $S + 1/5$ O, i.e., $(Ca + \frac{1}{2}\ Mg)/(S + 1/5\ O) \geq 1$, sulfur and oxygen can be precipitated sufficiently in the form of the stable and non-detrimental substances, and as a result, hot workability of the Fe-Ni alloy can be remarkably improved. The contents of calcium, magnesium, sulfur and oxygen should therefore satisfy the following formula:

$$\frac{Ca + 1/2\ Mg}{S + 1/5\ O} \geq 1.$$

The manner of reducing the silicon (Si) segregation rate in the surface portion of the Fe-Ni alloy sheet to up to 10% is described below with reference to FIGS. 3 and 4.

Figure 3:
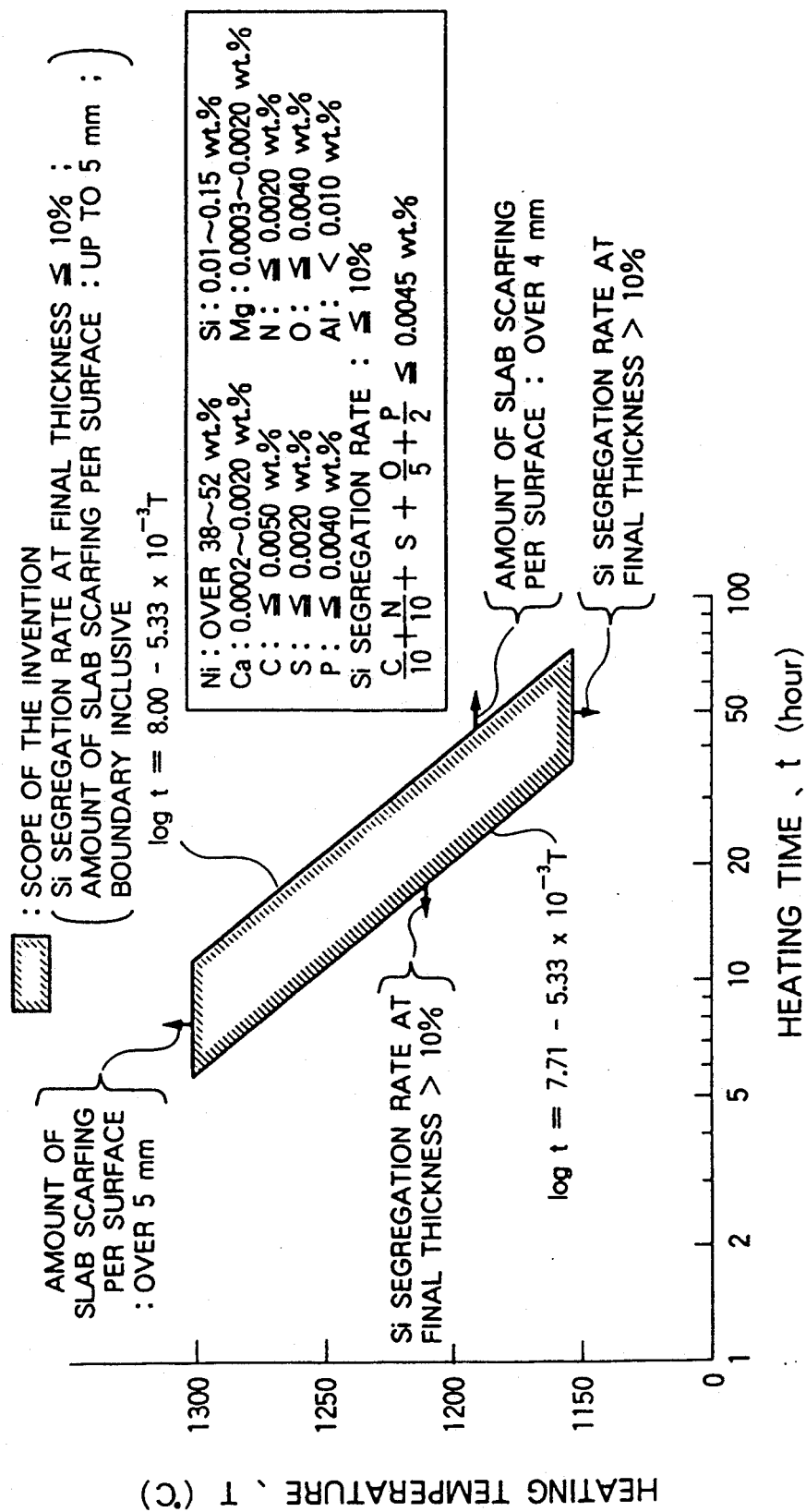
FIG. 3 is a graph illustrating, when heating an ingot or a continuously cast slab, each of which comprises an Fe-Ni alloy having a chemical composition within the scope of the present invention, and then slabbing-rolling same at a sectional reduction rate of at least 35%, the effect of each of the heating temperature (T)(°C.) and the heating time (t)(hr), on the silicon (Si) segregation rate in the surface portion of the Fe-Ni alloy sheet at the final thickness, and the amount of slab scarfing.

FIG. 3 is a graph illustrating, when heating an ingot or a continuously cast slab, each of which comprises an Fe-Ni alloy having a chemical composition within the scope of the present invention, and then slabbing-rolling same at a sectional reduction rate of at least 35%, the effect of each of the heating temperature (T)(°C.) and the heating time (t)(hr), on the silicon (Si) segregation rate in the surface portion of the Fe-Ni alloy sheet at the final thickness, and the amount of slab scarfing.

Figure 4:
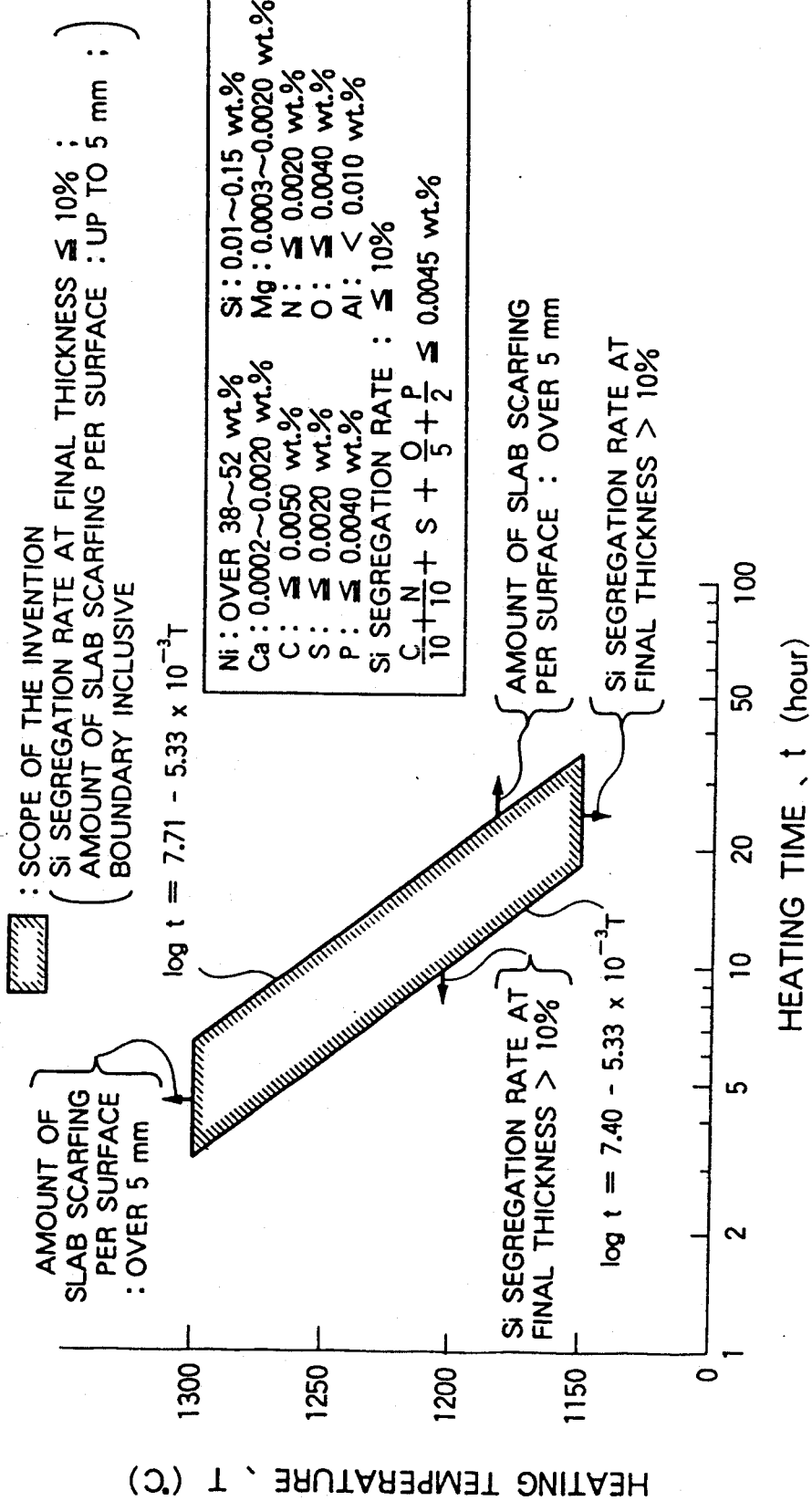
FIG. 4 is a graph illustrating, when heating an ingot or a continuously cast slab, each of which comprises an Fe-Ni alloy having a chemical composition within the scope of the present invention, then subjecting same to a primary slabbing rolling at a sectional reduction rate of from 20 to 70%, then heating same again, and then subjecting same to a secondary slabbing rolling at a sectional reduction rate of from 20 to 70%, the effect of each of the heating temperature (T)(°C.) and the heating time (t)(hr), on the silicon (Si) segregation rate in the surface portion of the Fe-Ni alloy sheet at the final thickness, and the amount of slab scarfing.

As is clear from FIG. 3, when the above-mentioned ingot or continuously cast slab is heated at a heating temperature (T)(°C.) for a heating time (t)(hr), which satisfy the following three formulae:

$1{,}150° \text{ C.} \leq T \leq 1{,}300° \text{ C.},$ $\log t \geq 7.71 - 5.33 \times 10^{-3} T, \text{ and}$ $\log t \leq 8.00 - 5.33 \times 10^{-3} T,$ then slabbing-rolled at a sectional reduction rate of at least 35%, and then slowly cooled, the amount of slab scarfing per surface is reduced to up to 5 mm, and the silicon segregation rate in the surface portion of the prepared Fe-Ni alloy sheet is reduced to up to 10%. When the heating temperature (T) is under 1,150° C., or the heating time (t) is: $\log t < 7.71 - 5.33 \times 10^{-3} T$, on the other hand, the silicon segregation rate is increased to over 10%. When the heating temperature (T) is over 1,300° C., or the heating time (t) is: $\log t > 8.00 - 5.33 \times 10^{-3} T$, the amount of slab scarfing per surface is increased to over 5 mm, resulting in a lower production yield. The heating temperature (T)(°C.) and the heating time (t)(hr), when slabbing-rolling the ingot or the continuously cast slab at a sectional reduction rate of at least 35%, should therefore be limited within the ranges of:

$1{,}150° \text{ C.} \leq T \leq 1{,}300° \text{ C.}$, and $7.71 - 5.33 \times 10^{-3} T \leq \log t \leq 8.00 - 5.33 \times 10^{-3} T.$ FIG. 4 is a graph illustrating, when heating an ingot or a continuously cast slab, each of which comprises an Fe-Ni alloy having a chemical composition within the scope of the present invention, then subjecting same to a primary slabbing rolling at a sectional reduction rate of from 20 to 70%, then heating same again, and then subjecting same to a secondary slabbing rolling at a sectional reduction rate of from 20 to 70%, the effect of each of the heating temperature (T)(°C.) and the heating time (t)(hr), on the silicon (Si) segregation rate in the surface portion of the Fe-Ni alloy sheet at the final thickness, and the amount of slab scarfing.

As is clear from FIG. 4, when the above-mentioned ingot or continuously cast slab is heated at a heating temperature (T)(°C.) for a heating time (t)(hr), which satisfy the following three formulae:

$1{,}150° \text{ C.} \leq T \leq 1{,}300° \text{ C.}$, $\log t \geq 7.40 - 5.33 \times 10^{-3} T$, and $\log t \leq 7.71 - 5.33 \times 10^{-3} T$, then subjected to a primary slabbing rolling at a sectional reduction rate within a range of from 20 to 70%, then heated again at a heating temperature for a heating time, which satisfy the three formulae presented above, then subjected to a secondary slabbing rolling at a sectional reduction rate within a range of from 20 to 70%, and then slowly cooled, the amount of slab scarfing per surface is reduced to up to 5 mm, and the silicon (Si) segregation rate in the surface portion of the prepared Fe-Ni alloy sheet is reduced to up to 10%. When either heating temperature (T) is under 1,150° C., or either heating time (t) is: $\log t < 7.40 - 5.33 \times 10^{-3} T$, on the other hand, the silicon segregation rate is increased to over 10%. When either heating temperature (T) is over 1,300° C., or either heating time (t) is: $\log t > 7.71 - 5.33 \times 10^{-3} T$, the amount of slab scarfing per surface is increased to over 5 mm, resulting in a lower production yield. The heating temperature (T)(° C.) and the heating time (t)(hr), when subjecting the ingot or the continuously cast slab to the primary slabbing rolling and the secondary slabbing rolling, respectively, at a sectional reduction rate within a range of from 20 to 70%, should therefore be limited within ranges of:

$1{,}150° \text{ C.} \leq T \leq 1{,}300° \text{ C.}$, and $7.40 - 5.33 \times 10^{-3} T \leq \log t \leq 7.71 - 5.33 \times 10^{-3} T.$ Even when the ingot or the continuously cast slab, each of which comprises the Fe-Ni alloy having a chemical composition within the scope of the present invention, is heated at a temperature for a time within the above-mentioned scope of the present invention, and then subjected to the slabbing rolling at a sectional reduction rate within the scope of the present invention, if a hydrogen sulfide ($H_2S$) concentration in the heating atmosphere in the heating furnace is over 100 ppm, embrittlement of the crystal grain boundaries is caused on the surface portion of the ingot or the continuously cast slab during the heating thereof under the effect of sulfur, and many surface flaws are produced on the slab during the slabbing rolling thereof, thus resulting in an amount of slab scarfing per surface of over 5 mm. The hydrogen sulfide concentration in the heating atmosphere in the heating furnace should therefore be limited to up to 100 ppm.

In order to further reduce the silicon (Si) segregation rate, it is necessary to apply the slow cooling after the slabbing rolling.

In addition to the slow cooling, prevention of the silicon (Si) segregation during the manufacture of an ingot, or the rapid solidification of the ingot through, for example, casting into a thin ingot, may be adopted in order to further reduce the silicon segregation rate. More specifically, the silicon segregation rate may be reduced by adopting the electromagnetic stirring during the casting of the ingot, the unidirectional solidification by the slight rolling reduction of the slab, the shortening of the solidification time by using a flat mold, and the combination of the hot working, the warm working and the cold working under the appropriate working and heat treatment conditions in the individual manufacturing steps.

Now, the present invention is described further in detail by means of examples.

EXAMPLE 1

Ingots Nos. 1 to 18 each having a chemical composition as shown in Table 1 and having a weight of seven tons were prepared by the ladle refining.

TABLE 1

|  | Constituent element |  |  |  |  | Incidental impurity |  |  |  |  |  |
|---|---|---|---|---|---|---|---|---|---|---|---|
| Ingot No. | Ni (wt. %) | Si (wt. %) | Ca (wt. %) | Mg (wt. %) | Other (wt. %) | C (wt. %) | N (wt. %) | S (wt. %) | O (wt. %) | P (wt. %) | Al (wt. %) |
| 1 | 41.4 | 0.07 | 0.0012 | 0.0012 | — | 0.0024 | 0.0014 | 0.0005 | 0.0021 | 0.001 | 0.003 |
| 2 | 41.2 | 0.10 | 0.0012 | 0.0011 | — | 0.0042 | 0.0016 | 0.0011 | 0.0030 | 0.002 | <0.001 |
| 3 | 40.9 | 0.06 | 0.0011 | 0.0016 | — | 0.0065 | 0.0017 | 0.0012 | 0.0032 | 0.002 | 0.010 |
| 4 | 41.0 | 0.05 | 0.0013 | 0.0014 | — | 0.0032 | 0.0025 | 0.0015 | 0.0025 | 0.002 | 0.008 |
| 5 | 41.5 | 0.04 | 0.0020 | 0.0020 | — | 0.0020 | 0.0015 | 0.0022 | 0.0020 | 0.002 | 0.008 |
| 6 | 41.2 | <0.01 | 0.0015 | 0.0015 | — | 0.0015 | 0.0019 | 0.0012 | 0.0055 | 0.002 | 0.006 |
| 7 | 40.9 | 0.10 | 0.0012 | 0.0014 | — | 0.0017 | 0.0017 | 0.0012 | 0.0015 | 0.005 | 0.006 |
| 8 | 41.2 | 0.16 | 0.0016 | 0.0012 | — | 0.0020 | 0.0017 | 0.0014 | 0.0035 | 0.002 | 0.009 |
| 9 | 41.3 | 0.10 | 0.0020 | — | Cr: 0.02 | 0.0018 | 0.0018 | 0.0003 | 0.0014 | 0.003 | 0.015 |
| 10 | 41.7 | 0.12 | 0.0022 | 0.0003 | — | 0.0022 | 0.0018 | 0.0012 | 0.0020 | 0.004 | 0.005 |
| 11 | 41.1 | 0.06 | 0.0001 | 0.0020 | — | 0.0025 | 0.0020 | 0.0007 | 0.0020 | 0.002 | 0.005 |
| 12 | 41.9 | 0.08 | 0.0004 | 0.0030 | — | 0.0030 | 0.0019 | 0.0013 | 0.0025 | 0.002 | 0.007 |
| 13 | 40.8 | 0.05 | 0.0017 | 0.0001 | — | 0.0020 | 0.0019 | 0.0015 | 0.0020 | 0.003 | 0.002 |
| 14 | 41.6 | 0.04 | 0.0018 | 0.0019 | — | 0.0025 | 0.0017 | 0.0019 | 0.0023 | 0.003 | 0.002 |
| 15 | 41.8 | 0.08 | 0.0002 | 0.0004 | — | 0.0022 | 0.0018 | 0.0002 | 0.0010 | 0.004 | 0.003 |
| 16 | 41.7 | 0.02 | 0.0016 | 0.0017 | — | 0.0024 | 0.0016 | 0.0018 | 0.0035 | 0.004 | 0.009 |

TABLE 1-continued

| | | | | | | | | | | |
|---|---|---|---|---|---|---|---|---|---|---|
| 17 | 41.5 | 0.01 | 0.0008 | 0.0005 | — | 0.0014 | 0.0018 | 0.0015 | 0.0021 | 0.003 | 0.008 |
| 18 | 41.4 | 0.07 | 0.0012 | 0.0012 | — | 0.0024 | 0.0014 | 0.0005 | 0.0021 | 0.001 | 0.003 |

| Ingot No. | Ca + 1/2 Mg (wt. %) | 1/10 C + 1/10 N + S + 1/5 O + 1/2 P (wt. %) | $\frac{Ca + 1/2 Mg}{S + 1/5 O}$ | Balance |
|---|---|---|---|---|
| 1 | 0.0018 | 0.0019 | 1.0 | Iron |
| 2 | 0.0018 | 0.0029 | 1.4 | |
| 3 | 0.0019 | 0.0037 | 1.0 | |
| 4 | 0.0020 | 0.0036 | 1.0 | |
| 5 | 0.0030 | 0.0040 | 1.2 | |
| 6 | 0.0023 | 0.0036 | 1.0 | |
| 7 | 0.0019 | 0.0043 | 1.3 | |
| 8 | 0.0022 | 0.0035 | 1.0 | |
| 9 | 0.0020 | 0.0024 | 3.4 | |
| 10 | 0.0024 | 0.0040 | 1.5 | |
| 11 | 0.0011 | 0.0038 | 1.0 | |
| 12 | 0.0019 | 0.0038 | 1.1 | |
| 13 | 0.0018 | 0.0039 | 1.1 | |
| 14 | 0.0028 | 0.0043 | 1.3 | |
| 15 | 0.0004 | 0.0032 | 1.0 | |
| 16 | 0.0025 | 0.0049 | 1.0 | |
| 17 | 0.0011 | 0.0037 | 0.6 | |
| 18 | 0.0018 | 0.0019 | 1.0 | |

The ladle used for the ladle refining of the ingots Nos. 1 to 18 was made of an MgO-CaO refractory containing CaO in an amount of up to 40 wt. %, and the molten slag used was a $CaO\text{-}SiO_2\text{-}Al_2O_3$ slag, having a ratio of $CaO/SiO_2$ within a range of from 0.65 to 0.8 and containing up to 3 wt. % $Al_2O_3$ and up to 15 wt. % MgO.

Each of the thus prepared ingots Nos. 1 to 17 was heated in a heating atmosphere having a hydrogen sulfide ($H_2S$) concentration of 60 ppm to a temperature of 1,200° C. for 12 hours, then subjected to a primary slabbing rolling at a sectional reduction rate of 60%, then heated again in a heating atmosphere having a hydrogen sulfide concentration of 60 ppm to a temperature of 1,200° C. for 12 hours, then subjected to a secondary slabbing rolling at a sectional reduction rate of 45%, and then slowly cooled to prepare each of slabs Nos. 1 to 17. On the other hand, the thus prepared ingot No. 18 was heated in a heating atmosphere having a hydrogen sulfide concentration of 60 ppm to a temperature of 1,200° C. for 15 hours, then slabbing-rolled at a sectional reduction rate of 78%, and then slowly cooled to prepare a slab No. 18.

For each of the above-mentioned slabs Nos. 1 to 18, the production of surface flaws was investigated by a visual observation of the entire surface of each slab and the adoption of a conventional flaw detecting method. The amount of slab surface scarfing was determined by measuring the amount of decrease in the thickness and the width of each slab after the cold scarfing by means of the fusion-scarfing and the grinding-scarfing. The results are shown in Table 2.

The evaluation criteria of the production of the slab surface flaws were as follows:

⊙: produced very slightly,
○: produced slightly,
Δ: produced seriously, and
×: produced very seriously.

TABLE 2

| Sample No. | Si segregation rate (%) | Production of slab surface flaws | Amount of slab surface scarfing (mm) | Adhesivity to silver plating layer | Solderability Without heating in open air | Solderability With heating in open air | Production of fine inner cracks | Production of whiskers during tin plating |
|---|---|---|---|---|---|---|---|---|
| 1 | 6 | ⊙ | 3 | ⊙ | ⊙ | ○ | None | None |
| 2 | 8 | ○ | 4 | ○ | ○ | ○ | None | None |
| 3 | 5 | Δ | 8 | Δ | Δ | × | None | Produced |
| 4 | 5 | Δ | 8 | Δ | Δ | × | None | Produced |
| 5 | 3 | × | 12 | × | × | × | None | Produced |
| 6 | 3 | Δ | 9 | × | × | × | None | Produced |
| 7 | 7 | Δ | 10 | Δ | ○ | Δ | None | None |
| 8 | 9 | ○ | 4 | × | Δ | × | None | Produced |
| 9 | 2 | × | 11 | Δ | Δ | × | Produced | Produced |
| 10 | 9 | ○ | 5 | Δ | Δ | × | None | Produced |
| 11 | 4 | Δ | 7 | ○ | Δ | × | Produced | Produced |
| 12 | 7 | ○ | 4 | Δ | Δ | × | None | Produced |
| 13 | 3 | Δ | 7 | ○ | Δ | × | Produced | Produced |
| 14 | 2 | ○ | 4 | Δ | Δ | × | None | Produced |
| 15 | 8 | Δ | 8 | ○ | Δ | × | Produced | Produced |
| 16 | 3 | Δ | 8 | ○ | × | × | Produced | Produced |
| 17 | 1 | ○ | 5 | ○ | ○ | Δ | None | None |
| 18 | 15 | ⊙ | 3 | Δ | Δ | × | None | Produced |

Then, each of the thus prepared slabs Nos. 1 to 18 was scarfed, applied with an oxidation preventing agent, heated to a temperature of 1,100° C., and subjected to a hot rolling to prepare each of hot-rolled coils Nos. 1 to 18. The hot rolling conditions included a total reduction rate of 82% at a temperature of at least 1,000° C., a total reduction rate of 98% at a temperature of at least 850° C., and a coiling temperature of the hot-rolled coil of from 550° to 750° C.

Each of the thus prepared hot-rolled coils Nos. 1 to 18 was descaled, subjected to repeated cycles each comprising a cold rolling and an annealing, then subjected to a temper rolling, and then subjected to a stress-relieving annealing to prepare each of Fe-Ni alloy sheets having a thickness of 0.15 mm (hereinafter referred to as the "samples") Nos. 1 to 18.

For each of the thus prepared samples Nos. 1 to 18, fine inner cracks were investigated by a conventional testing method using the ultrasonic wave. The results are also shown in Table 2.

Then, for each of the samples Nos. 1 to 18, the silicon (Si) segregation rate in the surface portion of each sample was investigated by means of the EPMA (abbreviation of Electron Probe Micro Analyzer). The results are also shown in Table 2.

Then, after the application of a degreasing treatment and a pickling treatment, each of the samples Nos. 1 to 18 was subjected to a silver plating treatment without applying a nickel strike plating to form a silver plating layer having a thickness of 2 $\mu$m on the surface of each sample. Each of the thus silver-plated samples Nos. 1 to 18 was heated in the open air at a temperature of 450° C. for three minutes to investigate the production of blisters in the silver plating layer, and adhesivity to the silver plating layer was evaluated on the basis of the production of blisters thus investigated. The results are also shown in Table 2. The evaluation criteria of adhesivity to the silver plating layer were as follows:

⊚: produced no blister per 4 cm$^2$ of the silver plating layer;
○: produced one blister per 4 cm$^2$ of the silver plating layer;
Δ: produced two to four blisters per 4 cm$^2$ of the silver plating layer; and
×: produced five or more blisters per 4 cm$^2$ of the silver plating layer.

Then, to carry out a test regarding solderability, another set of samples Nos. 1 to 18 not silver-plated was used. Each of the samples Nos. 1 to 18 of such another set was tin-plated to form a tin plating layer having a thickness of 1.5 $\mu$m on the surface thereof.

Then, a solderability test was carried out in accordance with the Menisco-graph method as specified in the Military Standard 883 of the United States. More specifically, each of the samples Nos. 1 to 18 tin-plated as described above was immersed for five seconds in a molten solder comprising 60 wt. % tin and 40 wt. % lead and having a temperature of 235±5° C. so as to give an immersion depth of 2 mm to measure the wetting time $t_2$ between the tin plating layer of each sample and molten solder, i.e., the time from the start of immersion to the moment when buoyancy caused by the surface tension of molten solder becomes null, or in other words, the time from the start of immersion to the moment when the contact angle between the surface of each sample and the surface of molten solder becomes 90°. Solderability was evaluated on the basis of the above-mentioned wetting time $t_2$. The evaluation criteria of solderability were as follows:

⊚: wetting time $t_2$ of up to 0.5 seconds;
○: wetting time $t_2$ within a range of from over 0.5 to up to 1.0 second;
Δ: wetting time $t_2$ within a range of from over 1.0 to up to 2.0 seconds; and
×: wetting time $t_2$ of over 2.0 seconds.

Furthermore, the above-mentioned solderability test was carried out for each of the samples Nos. 1 to 18 of another set tin-plated as described above, immediately after heating same to a temperature of 100° C. in the open air, to investigate the extent of deterioration of solderability caused by such heating. The results are also shown in Table 2.

As is clear from Table 2, the samples Nos. 1 and 2, each having a chemical composition within the scope of the present invention and having a silicon (Si) segregation rate within the scope of the present invention, showed only a slight production of the slab surface flaws. The production of the slab surface flaws was very slight particularly in the sample No. 1. The samples Nos. 1 and 2 were thus found to be excellent in hot workability. The samples Nos. 1 and 2 were furthermore free both from the production of fine inner cracks and from the production of whiskers in the tin plating layer. As a result, the samples Nos. 1 and 2 were found to be excellent in adhesivity to the silver plating layer and solderability.

In contrast, the sample No. 3, having a high carbon (C) content outside the scope of the present invention, showed a serious production of the slab surface flaws and the production of whiskers in the tin plating layer, and was thus found to be poor in all of hot workability, adhesivity to the silver plating layer and solderability.

The sample No. 4, having a high nitrogen (N) content outside the scope of the present invention, showed a serious production of the slab surface flaws, and the production of whiskers in the tin plating layer, and was thus found to be poor in all of hot workability, adhesivity to the silver plating layer and solderability.

The sample No. 5, having a high sulfur (S) content and a high value of Ca+½ Mg both outside the scope of the present invention, showed a very serious production of the slab surface flaws and the production of whiskers in the tin plating layer, and was thus found to be seriously poor in all of hot workability, adhesivity to the silver plating layer and solderability.

The sample No. 6, having a low silicon (Si) content and a high oxygen (O) content both outside the scope of the present invention, showed a serious production of the slab surface flaws and the production of whiskers in the tin plating layer, and was thus found to be poor in all of hot workability, adhesivity to the silver plating layer and solderability.

The sample No. 7, having a high phosphorus (P) content outside the scope of the present invention, showed a serious production of the slab surface flaws, and was thus found to be poor in all of hot workability, adhesivity to the silver plating layer and solderability.

The sample No. 8, having a low silicon (Si) content outside the scope of the present invention, showed the production of whiskers in the tin plating layer, and was thus found to be particularly poor in adhesivity to the silver plating layer and solderability.

The sample No. 9 was similar to the alloy sheet of the prior art in the chemical composition. The sample No. 9, having no magnesium content and a high aluminum (Al) content outside the scope of the present invention, showed a very serious production of the slab surface flaws, and was thus found to be poor in all of hot workability, adhesivity to the silver plating layer and solderability. Particularly, the sample No. 9 was found to be inferior to the samples Nos. 1 and 2 within the scope of the present invention in adhesivity to the silver plating layer having a thickness of 2 $\mu$m.

The sample No. 10, having a high calcium (Ca) content outside the scope of the present invention, showed the production of whiskers in the tin plating layer, and was thus found to be poor in adhesivity to the silver plating layer and solderability.

The sample No. 11, having a low calcium (Ca) content outside the scope of the present invention, showed a serious production of the slab surface flaws, and was thus found to be poor in hot workability and solderability.

The sample No. 12, having a high magnesium (Mg) content outside the scope of the present invention, showed the production of whiskers in the tin plating layer, and was thus found to be poor in adhesivity to the silver plating layer and solderability.

The sample No. 13, having a low magnesium (Mg) content outside the scope of the present invention, showed a serious production of the slab surface flaws, and was thus found to be poor in hot workability and solderability.

The sample No. 14, having a high value of $Ca + \frac{1}{2} Mg$ outside the scope of the present invention, showed the production of whiskers in the tin plating layer, and was thus found to be poor in adhesivity to the silver plating layer and solderability.

The sample No. 15, having a low value of $Ca + \frac{1}{2} Mg$ outside the scope of the present invention, showed a serious production of the slab surface flaws, and was thus found to be poor in hot workability and solderability.

The sample No. 16, having a high value of $1/10\ C + 1/10\ N + S + 1/5\ O + \frac{1}{2}\ P$ outside the scope of the present invention, showed a serious production of the slab surface flaws and the production of fine inner cracks, and was thus found to be poor in hot workability and solderability.

The sample No. 17 having a low value of

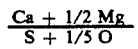

outside the scope of the present invention, showed a larger amount of slab surface scarfing than in the samples Nos. 1 and 2 within the scope of the present invention, and was thus found to be inferior to the samples Nos. 1 and 2 in hot workability.

The sample No. 18, having a high silicon (Si) segregation rate outside the scope of the present invention, showed the production of whiskers in the tin plating layer, and was thus found to be poor in adhesivity to the silver plating layer and solderability.

EXAMPLE 2

Each of the ingots Nos. 1 and 2 within the scope of the present invention shown in Table 1 and having a weight of seven tons was slabbing-rolled under the conditions as shown in Table 3, and then slowly cooled to prepare a slab. From each of the thus prepared slabs, each of Fe-Ni alloy sheets having a thickness of 0.15 mm (hereinafter referred to as the "samples") Nos. 19 to 32 was prepared by the same method as in the Example 1.

TABLE 3

| Ingot No. | Sample No. | H$_2$S concentration in heating atmosphere (ppm) | Primary slabbing rolling | | | Secondary slabbing rolling | | | Si segregation rate (%) | Remarks |
|---|---|---|---|---|---|---|---|---|---|---|
| | | | Heating temperature (°C.) | Heating time (hr) | Sectional reduction rate (%) | Heating temperature (°C.) | Heating time (hr) | Sectional reduction rate (%) | | |
| 2 | 19 | 50 | 1,200 | 23 | 77 | — | — | — | 6 | Sample of |
| | 20 | 55 | 1,280 | 11 | 78 | — | — | — | 5 | the invention (single slabbing) |
| | 21 | 53 | 1,200 | 21 | 32 | — | — | — | 11 | Sample for |
| | 22 | 53 | 1,200 | 16 | 77 | — | — | — | 13 | comparison |
| | 23 | 53 | 1,200 | 47 | 78 | — | — | — | 3 | (single slabbing) |
| 1 | 24 | 53 | 1,200 | 18 | 60 | 1,200 | 18 | 45 | 4 | Sample of |
| | 25 | 62 | 1,290 | 5 | 60 | 1,290 | 6 | 45 | 2 | the invention (double slabbing) |
| | 26 | 61 | 1,200 | 9 | 61 | 1,200 | 16 | 44 | 11 | Sample for |
| | 27 | 68 | 1,250 | 8 | 69 | 1,250 | 9 | 18 | 11 | comparison |
| | 28 | 68 | 1,250 | 8 | 61 | 1,250 | 15 | 45 | 8 | (double slabbing) |
| 2 | 29 | 125 | 1,200 | 30 | 78 | — | — | — | 6 | Sample for |
| | 30 | 54 | 1,350 | 11 | 77 | — | — | — | 3 | comparison (single slabbing) |
| 1 | 31 | 50 | 1,130 | 24 | 61 | 1,130 | 26 | 44 | 16 | Sample for |
| | 32 | 68 | 1,250 | 9 | 15 | 1,250 | 9 | 74 | 12 | comparison (double slabbing) |

For each of the above-mentioned slabs, the production of surface flaws and the amount of surface scarfing were investigated. For each of the thus prepared samples Nos. 19 to 32, fine inner cracks were investigated. Then, for each of the samples Nos. 19 to 32, the silicon (Si) segregation rate in the surface portion of each sample, and adhesivity to a silver plating layer were investigated. These investigations were carried out in the same manner as in the corresponding investigations described as to the Example 1. The results are shown in Table 4.

TABLE 4

| Ingot No. | Production of slab surface flaws | Amount of slab surface scarfing (mm) | Adhesivity to silver plating layer | Solderability | | Production of fine inner cracks | Production of whiskers during tin plating |
|---|---|---|---|---|---|---|---|
| | | | | Without heating in open air | With heating in open air | | |
| 19 | ◉ | 3 | ◉ | ◉ | ○ | None | None |
| 20 | ◉ | 3 | ◉ | ◉ | ○ | None | None |
| 21 | △ | 7 | △ | △ | × | None | Produced |
| 22 | ○ | 4 | △ | △ | × | None | Produced |
| 23 | △ | 9 | ○ | ○ | ○ | None | None |

TABLE 4-continued

| | | | Solderability | | | |
| Ingot No. | Production of slab surface flaws | Amount of slab surface scarfing (mm) | Adhesivity to silver plating layer | Without heating in open air | With heating in open air | Production of fine inner cracks | Production of whiskers during tin plating |
|---|---|---|---|---|---|---|---|
| 24 | ○ | 4 | ◉ | ◉ | ◉ | None | None |
| 25 | ○ | 4 | ◉ | ◉ | ◉ | None | None |
| 26 | ◉ | 3 | Δ | Δ | × | None | Produced |
| 27 | Δ | 9 | Δ | Δ | × | None | Produced |
| 28 | × | 11 | ○ | ○ | ○ | None | None |
| 29 | × | 16 | ○ | ○ | ○ | None | None |
| 30 | × | 12 | ◉ | ◉ | ○ | None | None |
| 31 | ◉ | 3 | Δ | Δ | × | None | Produced |
| 32 | Δ | 10 | Δ | Δ | × | None | Produced |

Each of the samples Nos. 19, 20, 24 and 25, as is clear from Table 4, which was slabbing-rolled with a hydrogen sulfide ($H_2S$) concentration in the heating atmosphere, a heating temperature, a heating time and a sectional reduction rate all within the respective ranges of the present invention and had a silicon (Si) segregation rate within the scope of the present invention, showed a slight production of the slab surface flaws, and was thus found to be excellent in all of hot workability, adhesivity to a silver plating layer and solderability.

In contrast, the sample No. 21 was subjected to the single slabbing rolling at a low sectional reduction rate outside the scope of the present invention. The sample No. 22 was subjected to the single slabbing rolling, and heated in the slabbing rolling for a short heating time outside the scope of the present invention. The sample No. 26 was subjected to the primary slabbing rolling and the secondary slabbing rolling, and heated in the primary slabbing rolling for a short heating time outside the scope of the present invention. The sample No. 27 was subjected to the primary slabbing rolling and the secondary slabbing rolling, and the sectional reduction rate in the secondary slabbing rolling was low outside the scope of the range of the present invention. The sample No. 31 was subjected to the primary slabbing rolling and the secondary slabbing rolling, and the heating temperature was low outside the scope of the present invention both in the primary slabbing rolling and in the secondary slabbing rolling. The sample No. 32 was subjected to the primary slabbing rolling and the secondary slabbing rolling, and the sectional reduction rate in the primary slabbing rolling was low outside the scope of the present invention. As a result, each of the samples Nos. 21, 22, 26, 27, 31 and 32 had a silicon (Si) segregation rate of over 10% in the surface portion thereof. As is clear from Table 4, therefore, each of the samples Nos. 21, 22, 26, 27, 31 and 32 showed the production of whiskers in the tin plating layer, and was thus found to be poor in adhesivity to the silver plating layer and solderability.

The sample No. 23 was subjected to the single slabbing rolling, and heated in the slabbing rolling for a long heating time outside the scope of the present invention. The sample No. 28 was subjected to the primary slabbing rolling and the secondary slabbing rolling, and heated in the secondary slabbing rolling for a long heating time outside the scope of the present invention. The sample No. 30 was subjected to the single slabbing rolling, and the heating temperature in the slabbing rolling was high outside the scope of the present invention. As a result, each of the samples Nos. 23, 28 and 30 showed a serious production of the slab surface flaws and a large amount of slab surface scarfing, and was thus found to be poor in hot workability.

The sample No. 29 was subjected to the single slabbing rolling with a high hydrogen sulfide ($H_2S$) concentration in the heating atmosphere in the heating furnace outside the scope of the present invention. As a result, the sample No. 29 showed a very serious production of the slab surface flaws and a large amount of slab surface scarfing, and was thus found to be poor in hot workability.

According to the present invention, as described above in detail, it is possible to provide an Fe-Ni alloy sheet, which is excellent in hot workability, adhesivity to a plating layer and solderability, and is high in the production yield, and a method for manufacturing same, thus providing industrially useful effects.

What is claimed is:

1. An Fe-Ni alloy sheet excellent in hot workability, adhesivity to a plating layer and solderability, which consists essentially of:

| | |
|---|---|
| nickel (Ni): | from over 38 to 52 wt. %, |
| silicon (Si): | from 0.01 to 0.15 wt. %, |
| calcium (Ca): | from 0.0002 to 0.0020 wt. %, |
| magnesium (Mg): | from 0.0003 to 0.0020 wt. %, |
| where, | |
| Ca + ½Mg: | from 0.0005 to 0.0025 wt. %, | and
the balance being iron and incidental impurities,
where, the contents of carbon (C), nitrogen (N), sulfur (S), oxygen (O), phosphorus (P) and aluminum (Al) as said incidental impurities being respectively:
up to 0.0050 wt. % for carbon,
up to 0.0020 wt. % for nitrogen,
up to 0.0020 wt. % for sulfur,
up to 0.0040 wt. % for oxygen,
up to 0.0040 wt. % for phosphorus, and
under 0.010 wt. % for aluminum,
where, $1/10\,C + 1/10\,N + S + 1/5\,O + \frac{1}{2} P \leq 0.0045$ wt. %, and $$\frac{Ca + 1/2\,Mg}{S + 1/5\,O} \geq 1; \text{ and}$$

a surface portion of said Fe-Ni alloy sheet having a silicon (Si) segregation rate, as expressed by the following formula, of up to 10%:

$$\left| \frac{\left(\begin{array}{c}\text{Si concentration in}\\ \text{segregation region}\end{array}\right) - \left(\begin{array}{c}\text{Average Si}\\ \text{concentration}\end{array}\right)}{(\text{Average Si concentration})} \right| \times 100.$$

2. A method for manufacturing an Fe-Ni alloy sheet excellent in hot workability, adhesivity to a plating layer and solderability, which comprises the steps of:
preparing an ingot or a continuously cast slab of an Fe-Ni alloy consisting essentially of:

| | |
|---|---|
| nickel (Ni): | from over 38 to 52 wt. %, |
| silicon (Si): | from 0.01 to 0.15 wt. %, |
| calcium (Ca): | from 0.0002 to 0.0020 wt. %, |
| magnesium (Mg): | from 0.0003 to 0.0020 wt. %, |
| where, | |
| Ca + ½Mg: | from 0.0005 to 0.0025 wt. %, | and
the balance being iron and incidental impurities,
where, the contents of carbon (C), nitrogen (N), sulfur (S), oxygen (O), phosphorus (P) and aluminum (Al) as said incidental impurities being respectively:
up to 0.0050 wt. % for carbon,
up to 0.0020 wt. % for nitrogen,
up to 0.0020 wt. % for sulfur,
up to 0.0040 wt. % for oxygen,
up to 0.0040 wt. % for phosphorus, and
under 0.010 wt. % for aluminum,
where, $1/10\,C + 1/10\,N + S + 1/5\,O + \frac{1}{2}P \leq 0.0045$ wt. %, and $$\frac{Ca + 1/2\,Mg}{S + 1/5\,O} \geq 1;$$

subjecting said ingot or said continuously cast slab to a slabbing rolling, a scarfing, a hot rolling, a descaling, another scarfing, at least one cold rolling accompanied by a recrystallization annealing, a temper rolling and a stress-relieving annealing in this order to prepare a sheet of said Fe-Ni alloy;
heating said ingot or said continuously cast slab, when subjecting same to said slabbing rolling, in a heating atmosphere having a hydrogen sulfide (H$_2$S) concentration of up to 100 ppm to a temperature (T)(° C.) within a range of from 1,150 to 1,300° C. for a period of time (t)(hr) as expressed by the following formula:

$$7.71 - 5.33 \times 10^3 T \leq \log t \leq 8.00 - 5.33 \times 10^{-3} T,$$

then, subjecting same to said slabbing rolling at a sectional reduction rate of at least 35%, and then slowly cooling same, thereby adjusting a silicon (Si) segregation rate, as expressed by the following formula, of a surface portion of said Fe-Ni alloy sheet to up of 10%.

$$\left| \frac{\left(\begin{array}{c}\text{Si concentration in}\\ \text{segregation region}\end{array}\right) - \left(\begin{array}{c}\text{Average Si}\\ \text{concentration}\end{array}\right)}{(\text{Average Si concentration})} \right| \times 100.$$

3. A method for manufacturing an Fe-Ni alloy sheet excellent in hot workability, adhesivity to a plating layer and solderability, which comprises the steps of:
preparing an ingot or a continuously cast slab of an Fe-Ni alloy consisting essentially of:

| | |
|---|---|
| nickel (Ni): | from over 38 to 52 wt. %, |
| silicon (Si): | from 0.01 to 0.15 wt. %, |
| calcium (Ca): | from 0.0002 to 0.0020 wt. %, |
| magnesium (Mg): | from 0.0003 to 0.0020 wt. %, |
| where, | |
| Ca + ½Mg: | from 0.0005 to 0.0025 wt. %, | and
the balance being iron and incidental impurities,
where, the contents of carbon (C), nitrogen (N), sulfur (S), oxygen (O), phosphorus (P) and aluminum (Al) as said incidental impurities being respectively:
up to 0.0050 wt. % for carbon,
up to 0.0020 wt. % for nitrogen,
up to 0.0020 wt. % for sulfur,
up to 0.0040 wt. % for oxygen,
up to 0.0040 wt. % for phosphorus, and
under 0.010 wt. % for aluminum,
where, $1/10\,C + 1/10\,N + S + 1/5\,O + \frac{1}{2}P \leq 0.0045$ wt. %, and $$\frac{Ca + 1/2\,Mg}{S + 1/5\,O} \geq 1;$$

subjecting said ingot or said continuously cast slab to a slabbing rolling, a scarfing, a hot rolling, a descaling, another scarfing, at least one cold rolling accompanied by a recrystallization annealing, a temper rolling and a stress-relieving annealing in this order to prepare a sheet of said Fe-Ni alloy;
heating said ingot or said continuously cast slab, when subjecting same to said slabbing rolling, in a heating atmosphere having a hydrogen sulfide (H$_2$S) concentration of up to 100 ppm to a temperature (T)(° C.) within a range of from 1,150 to 1,300° C. for a period of time (t)(hr) as expressed by the following formula:

$$7.40 - 5.33 \times 10^{-3} T \leq \log t \leq 7.71 - 5.33 \times 10^{-3} T,$$

then subjecting same to a primary slabbing rolling as part of said slabbing rolling at a sectional reduction rate within a range of from 20 to 70%, then heating same again in a heating atmosphere having a hydrogen sulfide (H$_2$S) concentration of up to 100 ppm to a temperature (T)(° C.) within a range of from 1,150 to 1,300° C. for a period of time (t)(hr) as expressed by the above-mentioned formula, then subjecting same to a secondary slabbing rolling as part of said slabbing rolling at a sectional reduction rate within a range of from 20 to 70%, and then slowly cooling same, thereby adjusting a silicon (Si) segregation rate, as expressed by the following formula, of a surface portion of said Fe-Ni alloy sheet to up to 10%:

$$\left| \frac{\left(\begin{array}{c}\text{Si concentration in}\\ \text{segregation region}\end{array}\right) - \left(\begin{array}{c}\text{Average Si}\\ \text{concentration}\end{array}\right)}{(\text{Average Si concentration})} \right| \times 100.$$

4. The Fe-Ni alloy sheet of claim 1, wherein carbon is present in an amount of up to 0.0030 wt. %.

5. The Fe-Ni alloy sheet of claim 1, wherein nitrogen is present in an amount of up to 0.0015 wt. %.

6. The Fe-Ni alloy sheet of claim 1, wherein sulfur is present in an amount of up to 0.0010 wt. %.

7. The Fe-Ni alloy sheet of claim 1, wherein oxygen is present in an amount of up to 0.0025 wt. %.

8. The Fe-Ni alloy sheet of claim 1, wherein phosphorous is present in an amount of up to 0.0010 wt. %.

9. The Fe-Ni alloy sheet of claim 1, wherein aluminum is present in an amount of up to 0.0050 wt. %.

10. The Fe-Ni alloy sheet of claim 4, wherein nitrogen is present in an amount of up to 0.0015 wt. %, sulfur is present at an amount of up to 0.0010 wt. %, oxygen is present in an amount of up to 0.0025 wt. %, phosphorus is present in an amount of up to 0.0010 wt. % and aluminum is present in an amount of up to 0.0050 wt. %.

* * * * *